US009966253B2

(12) United States Patent
Cheng et al.

(10) Patent No.: US 9,966,253 B2
(45) Date of Patent: May 8, 2018

(54) FORMING NANOTIPS (71) Applicant: International Business Machines Corporation, Armonk, NY (US)

(72) Inventors: Kangguo Cheng, Schenectady, NY (US); Ramachandra Divakaruni, Ossining, NY (US); Juntao Li, Cohoes, NY (US); Shogo Mochizuki, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/054,005

(22) Filed: Feb. 25, 2016

(65) Prior Publication Data
US 2017/0250248 A1    Aug. 31, 2017

(51) Int. Cl.
H01L 29/06 (2006.01)
H01L 21/02 (2006.01)
H01J 9/02 (2006.01)
G01Q 70/14 (2010.01)
G01Q 70/16 (2010.01)

(52) U.S. Cl.
CPC ........ H01L 21/02236 (2013.01); H01J 9/025 (2013.01); *G01Q 70/14* (2013.01); *G01Q 70/16* (2013.01)

(58) Field of Classification Search
CPC ............. H01L 29/0665; H01L 29/0684; H01L 29/161; H01L 21/02236; H01L 21/0251; H01L 21/0245; H01L 29/66439; Y10S 977/701; Y10S 977/813; Y10S 977/814; Y10S 977/826; Y10S 977/874; Y10S 977/875; G01Q 60/16; G01Q 70/06; G01Q 70/10; G01Q 70/14
USPC .......................................................... 257/41
See application file for complete search history.

(56) References Cited

U.S. PATENT DOCUMENTS

| 5,211,707 | A | 5/1993 | Ditchek et al. |
| 6,960,528 | B2 | 11/2005 | Chen et al. |
| 7,208,372 | B2 * | 4/2007 | Hsu ........................ H01L 27/101 257/E27.071 |
| 7,402,445 | B2 | 7/2008 | Georgiev et al. |
| 7,645,669 | B2 | 1/2010 | Hsu et al. |
| 8,443,460 | B2 | 5/2013 | Foucher et al. |

(Continued)

OTHER PUBLICATIONS

Hsi-Lien Hsiao, "Low temperature selective growth and field emission characteristics of tapered SiGe nanowires array", Proceedings of the 5th WSEAS Int. Conf. on Microelectronics, Nanoelectronics, Optoelectronics, Prague, Czech Republic, Mar. 12-14, 2006 (pp. 40-43).

(Continued)

*Primary Examiner* — Kevin M Picardat
(74) *Attorney, Agent, or Firm* — Law Offices of Ira D. Blecker, P.C.

(57) ABSTRACT

A nanotip apparatus which includes nanotips arranged in a pattern on a semiconductor base. Each of the nanotips have a pointed tip portion and a base portion in contact with the semiconductor base. Further, each of the nanotips include a gradient of silicon germanium (SiGe) with the highest concentration of germanium being at the pointed tip portion and the lowest concentration of germanium being at the base in contact with the semiconductor base. Also disclosed is a method in which the nanotips may be formed.

20 Claims, 5 Drawing Sheets

(56) References Cited

U.S. PATENT DOCUMENTS

| | | |
|---|---|---|
| 8,530,907 B2 | 9/2013 | Chen et al. |
| 2007/0082459 A1 | 4/2007 | Faris |
| 2007/0284991 A1* | 12/2007 | Egi .................. C09K 11/06 |
| | | 313/479 |
| 2008/0287030 A1* | 11/2008 | Kim .................. H01J 9/025 |
| | | 445/46 |
| 2010/0229265 A1 | 9/2010 | Jin et al. |
| 2011/0159365 A1* | 6/2011 | Loveness ............ H01M 4/0428 |
| | | 429/218.1 |
| 2012/0301981 A1 | 11/2012 | Ozgur et al. |
| 2013/0298977 A1* | 11/2013 | Chen .................. B82Y 30/00 |
| | | 136/255 |
| 2014/0273535 A1 | 9/2014 | Gupta et al. |
| 2015/0102386 A1* | 4/2015 | Chen ............... H01L 21/823431 |
| | | 257/192 |
| 2015/0200223 A1* | 7/2015 | Lee .................. H01L 27/14689 |
| | | 257/292 |
| 2016/0204283 A1* | 7/2016 | Patolsky ............ H01L 21/0245 |
| | | 136/255 |

OTHER PUBLICATIONS

Ichikawa, Masakazu, "Growth of Si and Ge nanostructures on Si substrates using ultrathin SiO2 technology" IEEE Journal of Quantum Electronics, Aug. 2002, vol. 38, Issue: 8, pp. 988-994.

A.Evtukh et el., "Peculiarities of electron field emission from SiGe nanoislands", Technical Digest, 2014 27th International Vacuum Nanoelectronics Conference, Jul. 6-10, 2014, Engelberg, Switzerland, pp. 90-91.

* cited by examiner

FORMING NANOTIPS

BACKGROUND

The present exemplary embodiments pertain to nanotips and methods for forming nanotips and nanotip arrays.

Nanometer-scale tips, or nanotips, are microscopic filaments that have endpoint-diameters on the nanometer scale. Nanotips have attracted considerable interest in the last decade because of distinctive differences in the properties of these nanostructures compared with bulk material. Nanotips are of increasing interest to numerous industries due to their potential for commercial application.

BRIEF SUMMARY

The various advantages and purposes of the exemplary embodiments as described above and hereafter are achieved by providing, according to one aspect of the exemplary embodiments, a nanotip apparatus which includes a plurality of nanotips arranged in a pattern on a semiconductor base, each of the nanotips having a pointed tip portion and a base portion in contact with the semiconductor base. Each of the nanotips further including a gradient of silicon germanium (SiGe) with the highest concentration of germanium being at the tip and the lowest concentration of germanium being at the base in contact with the semiconductor base.

According to another aspect of the exemplary embodiments, there is provided a method. The method includes: forming a substrate comprising a silicon germanium (SiGe) gradient layer on a semiconductor base such that there is a greater concentration of germanium at a top of the SiGe layer away from the semiconductor base than at a bottom of the SiGe layer in contact with the semiconductor base; patterning the SiGe gradient layer to form SiGe pillars; depositing an oxide layer over and between the SiGe pillars; and oxidizing the SiGe pillars such that a top of the SiGe pillars is oxidized faster than a bottom of the SiGe pillars in contact with the silicon base, the oxidizing causing the silicon in the SiGe pillars to react with oxygen to form an oxide and be partially removed from the SiGe pillars such that tapered SiGe pillars are formed with the top of the SiGe pillars forming a tip and having a greater concentration of germanium at the tip than at the bottom of the pillars.

According to a further aspect of the exemplary embodiments, there is provided a method. The method includes: forming a substrate comprising an array of SiGe pillars on a semiconductor substrate, the SiGe pillars having a germanium gradient within the SiGe pillars such that there is a greater concentration of germanium at a top of the SiGe pillars away from the semiconductor base than at a bottom of the SiGe pillars in contact with the semiconductor base; and oxidizing the SiGe pillars such that tapered SiGe pillars are formed with the top of the SiGe pillars forming a tip and having a greater concentration of germanium at the tip than at the bottom of the pillars.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1 to 9 illustrate an exemplary embodiment for forming SiGe pillars wherein:

DETAILED DESCRIPTION

Nanotips are of increasing interest to numerous industries due to their potential for commercial application. One of the most important applications of nanotips is field emitters as electron source and field emission devices. Another important application of nanotips is for nanometer-cantilevers.

The present exemplary embodiments provide a method for forming dense arrays of nanotip field emitters, a structure of a dense array of nanotips and an apparatus including the nanotip field emitters.

Figure 1:
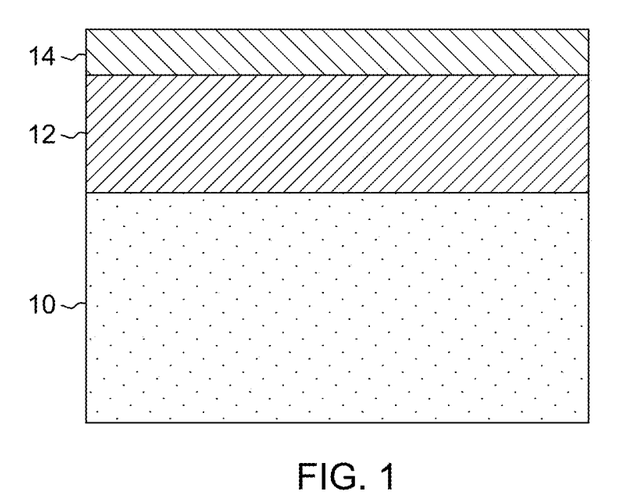
FIG. 1 is a cross sectional view illustrating the formation of an epitaxial SiGe layer on a semiconductor substrate.

Referring to the Figures in more detail, and particularly referring to FIG. 1, there is illustrated a starting structure for the exemplary embodiments. A bulk semiconductor substrate 10 may include an epitaxial layer of silicon germanium (SiGe) 12. The germanium concentration of the SiGe layer 12 may preferably range from about 10% to about 50% (atomic concentration), although a germanium concentration greater than 50 atomic percent or less than 10 atomic percent may also be within the scope of the exemplary embodiments.

Suitable semiconductor substrates may include, but are not limited to, silicon (Si), strained Si, silicon carbide (SiC), germanium (Ge), silicon germanium (SiGe), silicon-germanium-carbon (SiGeC), Si alloys, Ge alloys, gallium arsenide (GaAs), indium arsenide (InAs), indium phosphide (InP), or any combination thereof.

Figure 2:
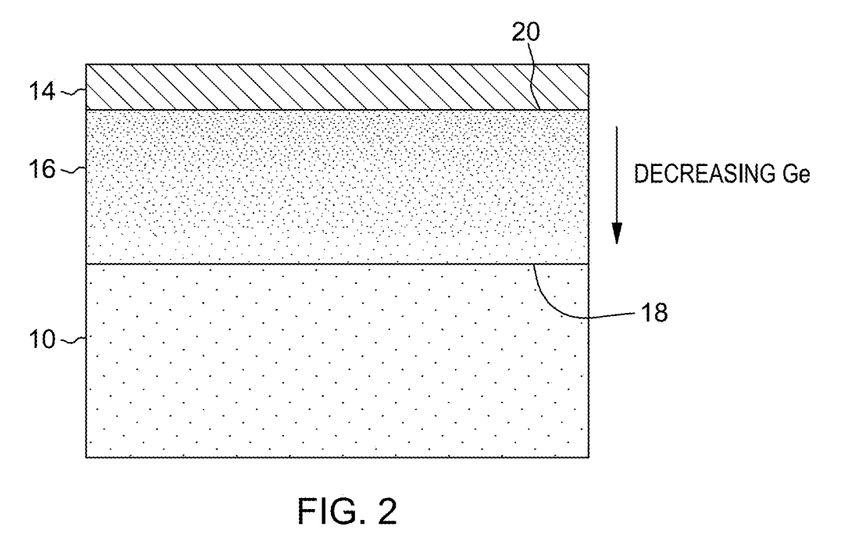
FIG. 2 is a cross sectional view illustrating the transformation of the epitaxial SiGe layer into a SiGe gradient layer.

Additionally, an optional layer of oxide 14 may be deposited on the SiGe layer 12. The SiGe layer 12 may have a thickness of about 20 to 100 nanometers (nm) while the optional oxide layer 14 may have a thickness of about 5 to 10 nm. Referring now to FIG. 2, the semiconductor substrate 10, SiGe layer 12 and optional oxide layer 14 have undergone a thermal anneal process to create a SiGe gradient layer, now referred to as SiGe gradient layer 16. The thermal anneal process may be done without oxide layer 14 present.

The thermal anneal process may be performed in an inert environment, such as nitrogen or argon. Alternatively, the thermal anneal process may be performed in an oxidation process containing oxygen or water vapor. The annealing temperature may range from about 800° C. to about 1250° C. The anneal process may be furnace anneal, rapid thermal anneal, flash anneal, or any suitable combination of those processes. The anneal time may range from about 1 millisecond to about 2 hours, depending on the anneal temperature. Higher anneal temperatures may require shorter anneal times. A typical anneal condition may be about 10 minutes at 1000° C.

During the anneal process, the germanium inside the SiGe layer will diffuse from a higher germanium concentration region to a lower germanium concentration region. In the context of the exemplary embodiments, the germanium will diffuse from the SiGe layer 12 to the semiconductor substrate 10 so eventually a SiGe layer 16 with graded germanium concentration is formed. Further away from the semiconductor substrate/SiGe layer interface 18, the germanium atoms have a longer diffusion path than those close to the semiconductor substrate/SiGe layer interface 18, so the final germanium distribution inside the SiGe gradient layer 16 will be the highest germanium concentration at the top 20 of the SiGe gradient layer 16, and it will gradually decrease toward the semiconductor substrate/SiGe layer interface 18 where the germanium concentration will be the lowest. At the semiconductor substrate/SiGe layer interface 18, the germanium concentration may be zero or very close to zero. FIG. 2 has been annotated to indicate the direction of decreasing germanium concentration.

During the thermal anneal process, the SiGe layer 12 that was on the semiconductor substrate 10 has now converted a top portion of the semiconductor substrate 10 to a SiGe gradient region. Within that region, the proportion of germanium atoms gradually decreases and the proportion of semiconductor substrate atoms, for example silicon, gradually increases in the SiGe gradient region until there is all semiconductor substrate atoms, for example silicon, at the semiconductor substrate/SiGe layer interface 18. The SiGe gradient into the semiconductor substrate 10 may have a thickness of about 5 to 50 nm.

In the case of thermal annealing process in an oxidation environment (so-called condensation process), silicon in the original SiGe layer reacts with oxygen to form silicon oxide. Meanwhile, germanium is repelled (condensed) to the remaining SiGe layer. The silicon oxide may be removed, e.g., by an aqueous solution containing hydrofluoric acid. After the condensation process, the germanium concentration at the top of the SiGe may be greater than the germanium concentration in the original SiGe layer 12.

In the case of thermal annealing in an inert environment to create the graded SiGe layer 16, some germanium may diffuse into the semiconductor substrate 10. In this case, the germanium concentration at the top of the SiGe layer 16 after annealing may be less than the original germanium concentration.

Graded concentrations of germanium percentage alternatively may be achieved by recipe adaptation such as by varying the germanium precursor flow. Additionally, pressure may also be used to optimize uniformity of thickness of the multiple concentrations of germanium. Then, the SiGe gradient layer 16 may be created by depositing a graded SiGe layer by chemical vapor deposition or similar process. Initially, the precursor gases would comprise all silicon precursor gas or at least a very low germanium precursor gas flow. Thereafter, the silicon precursor gas flow would be gradually decreased while the germanium precursor gas flow would be gradually increased until the desired thickness of the SiGe gradient layer 16 has been achieved. It is also within the scope of the exemplary embodiments to deposit a SiGe gradient layer 16, as just described, and then perform the thermal annealing as described above, either in an inert atmosphere or in an oxidation environment, to modulate the germanium concentration to any desired gradient.

Figure 3:
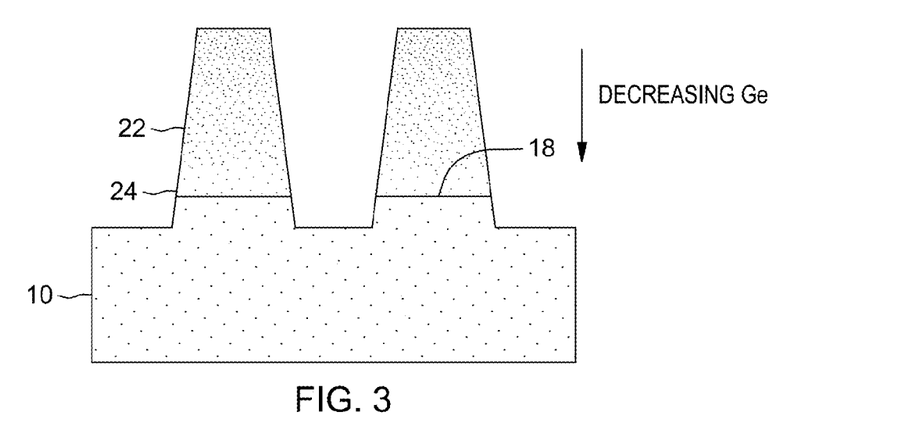
FIG. 3 is a cross sectional view illustrating the patterning of the SiGe gradient layer into SiGe pillars.

The structure shown in FIG. 2 may be then patterned to form SiGe pillars 22 as shown in FIG. 3. The patterning may occur by depositing a hard mask layer (not shown) over the SiGe gradient layer 16.

This optional hard mask layer may include, for example, a dielectric material composed of a nitride, oxide, oxynitride material, and/or any other suitable dielectric layer that may be deposited over the SiGe gradient layer 16. The hard mask layer may include a single layer of dielectric material or multiple layers of dielectric materials. The hard mask layer may be formed by a deposition process, such as chemical vapor deposition (CVD) and/or atomic layer deposition (ALD). Chemical vapor deposition (CVD) is a deposition process in which a deposited species is formed as a result of chemical reaction between gaseous reactants at greater than room temperature (25° C. to 900° C.), wherein solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. Alternatively, the optional hard mask layer may be formed using a growth process, such as thermal oxidation or thermal nitridation.

If the optional oxide layer 14 is present, the hard mask layer may be placed over the optional oxide layer 14. After the hard mask layer is appropriately patterned to define areas where the SiGe pillars 22 may be formed, the hard mask layer may be exposed to a reactive ion etching (RIE) process in which the optional oxide layer 14, if present, and the SiGe gradient layer 16 may be patterned to form the SiGe pillars 22. After the patterning of the SiGe pillars 22, the hard mask layer and optional oxide layer 14, if present, may be conventionally stripped to reveal the SiGe pillars 22 shown in FIG. 3.

Figure 4:
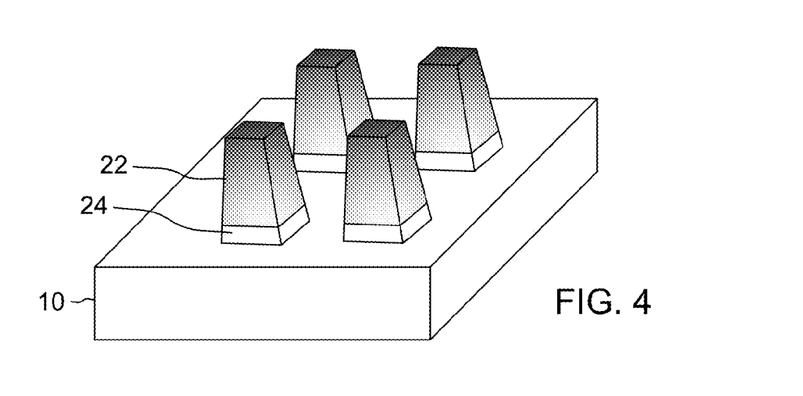
FIG. 4 is a perspective view illustrating the SiGe pillars of FIG. 3.

A perspective view of the SiGe pillars 22 is shown in FIG. 4. The SiGe pillars 22 may have the shape of a truncated pyramid. It is noted that the SiGe pillars 22 may have a tapered profile. A vertical profile may be obtained by adjusting the RIE parameters. It is preferred that the RIE process proceed until the SiGe gradient layer 16 is entirely etched through. During this process, some etching into the semiconductor substrate 10 may occur to form semiconductor pillars 24 underneath the SiGe pillars 22.

Since the SiGe pillars 22 are formed directly from the SiGe gradient layer 16, the SiGe pillars 22 will have the same SiGe gradient as was present in the SiGe gradient layer 16. FIG. 3 has been annotated to indicate the direction of decreasing germanium concentration.

Figure 5:
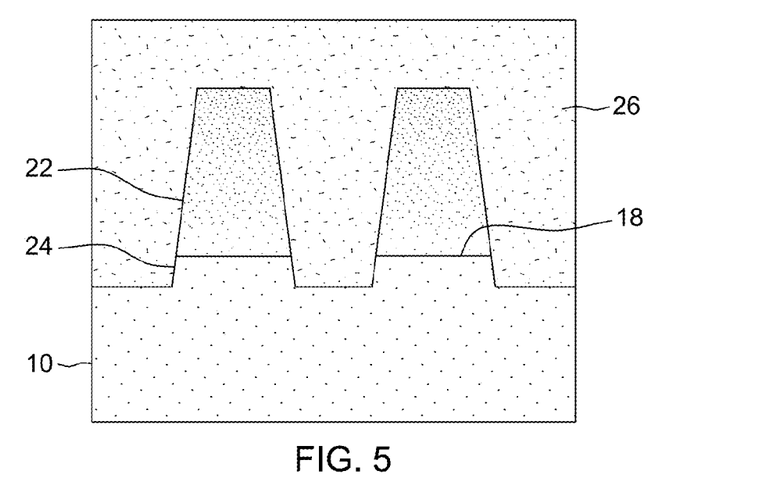
FIG. 5 is a cross sectional view illustrating the formation of an oxide encapsulating the SiGe pillars.

Referring now to FIG. 5, an oxide 26 may be deposited to encapsulate the SiGe pillars 22. A flowable oxide may be applied to the wafer by spin-coating followed by a thermal anneal to densify the oxide and form oxide 26. Spin-on glass (SOG) is one such flowable oxide. SOG typically includes $SiO_2$ suspended in a solvent. Alternatively, a two stage oxide deposition process may be performed to deposit an oxide, etch back by RIE, and deposit the oxide again to form oxide 26. Flowable oxides, high aspect ratio processes (HARP), enhanced high aspect ratio processes (eHARP), and other techniques may be used to fill the area between the SiGe pillars 22. As another alternative, the oxide 26 may be an oxide deposited by atomic layer deposition or low-pressure chemical vapor deposition (LPCVD). In a preferred exemplary embodiment, the flowable oxide may be utilized as the oxide 26. The flowable oxide flows into the gaps between the SiGe pillars 22 to provide a uniform surface coverage.

Optionally, after depositing the oxide 26, a densification anneal may be performed to enhance densification of the oxide 26 to provide mechanical support to the SiGe pillars 22 during subsequent processing. The densification anneal process is optional, depending on the deposited oxide quality. For example, when the oxide is deposited by a spin-on technique, it is desired to have a densification anneal to improve the oxide quality. The densification anneal may be performed in an inert environment containing argon, nitrogen, helium, xenon and/or hydrogen. Alternatively, the densification anneal may be performed in an oxygen-containing atmosphere(s), for example, in an ozone-containing atmosphere at a substrate temperature below about 400° C. Under some conditions, for example, substrate temperatures from about 100° C. to about 200° C., the conversion to a dense oxide has been found to be substantially complete during deposition of the oxide so a relatively high temperature anneal in an oxygen-containing environment may be unnecessary in the exemplary embodiments. The oxide 26 and densification anneal may ensure that the SiGe pillars 22 remain vertical during the subsequent processing. In one exemplary embodiment, the densification anneal may be performed at a temperature ranging from about 500° C. to about 800° C. In another exemplary embodiment, the densification anneal may be performed at a temperature ranging from about 900° C. to about 1100° C. The annealing time depends on the annealing temperature. Typical annealing time ranges from about 1 minute to about 1 hour with the shorter time corresponding to the higher annealing temperature.

Figure 6:
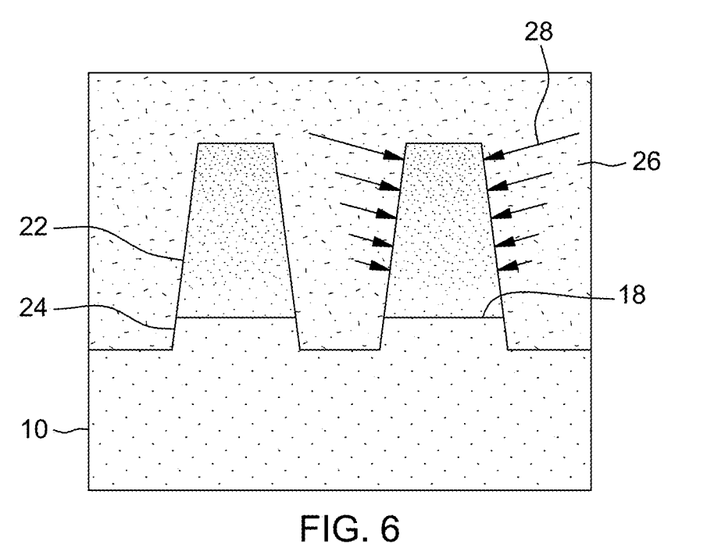
FIG. 6 is a cross sectional view illustrating a thermal condensation process.

Referring now to FIG. 6, the SiGe pillars 22 may undergo a thermal condensation process. The thermal condensation process, indicated by arrows 28, is an oxidation of the SiGe pillars 22 as the thermal condensation process is done in environment with oxygen.

Figure 7:
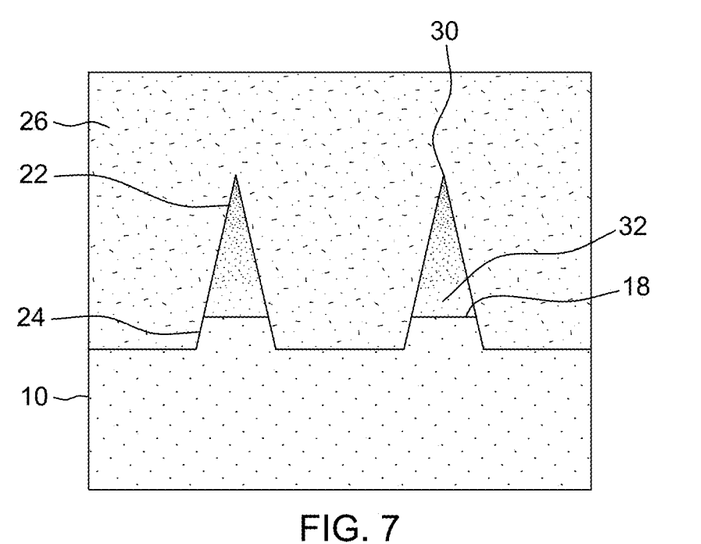
FIG. 7 is a cross sectional view illustrating the SiGe pillars of FIG. 6 after the thermal condensation process.

The condensation processing conditions may include an oxygen pressure of 10 Torr to 1000 Torr and a temperature of 700° C. to 1250° C. for 1 second to 30 minutes depending on the temperature and oxygen pressure. During oxidation, the oxygen may be attracted to the silicon in the SiGe pillars 22 but not to the germanium. The silicon in the SiGe pillars 22 and oxygen react to form silicon oxide so that the silicon in the SiGe pillars 22 moves outwardly from the SiGe pillars 22 into the oxide 26. The germanium in the SiGe pillars 22 however, is repelled to the center core of the SiGe pillars 22. The germanium also moves downwardly into the semiconductor substrate 10 and mixes with any silicon in the semiconductor substrate 10 to form SiGe. With respect to the SiGe pillars 22, the higher the germanium concentration, the faster the oxidation rate. Consequently, the tops 30 of the SiGe pillars 22, having the higher germanium concentration, are oxidized faster than the bottoms 32 of the SiGe pillars 22, having the lower germanium concentration. As a result, tapered SiGe pillars 22 with sharp tips, also referred to as 30, are formed as shown in FIG. 7. The SiGe pillars 22 with sharp tips 30 may also be referred to as SiGe nanotips.

In some embodiments, the condensation anneal process may be combined with the densification anneal, if present, in a single anneal process. In this case, the deposited oxide may be densified and the germanium concentration at the tip 30 of the SiGe nanotip may be enriched at the same time. For example, a high densification temperature in an oxidizing environment may also produce some enrichment of the SiGe nanotip. In some embodiments, the condensation anneal process and the densification anneal process may be performed in two separate anneal processes.

The sharp tip 30 of the SiGe pillars 22 has the highest germanium concentration. The sharp tip 30 may have a radius dimension of about 2 to 5 nm. In another exemplary embodiment, the dimension may be about 5 to 50 nm. Tips with a radius dimension less than about 2 nm or greater than about 50 nm may also be formed.

Figure 8:
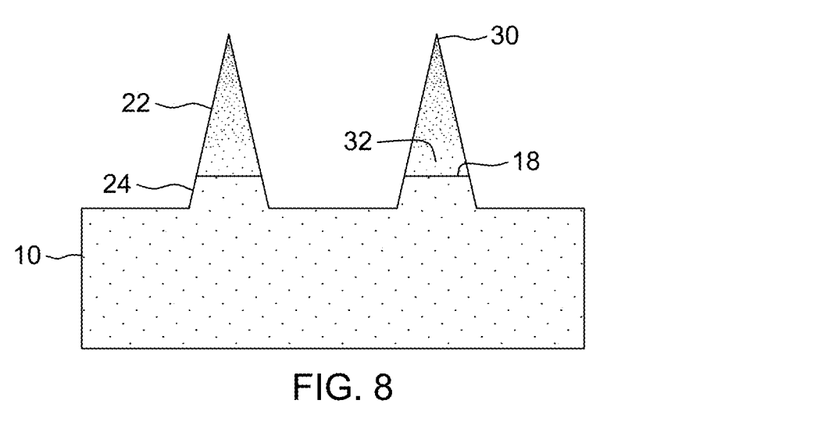
FIG. 8 is a cross sectional view illustrating the SiGe pillars of FIG. 7 after removal of the oxide.
Figure 9:
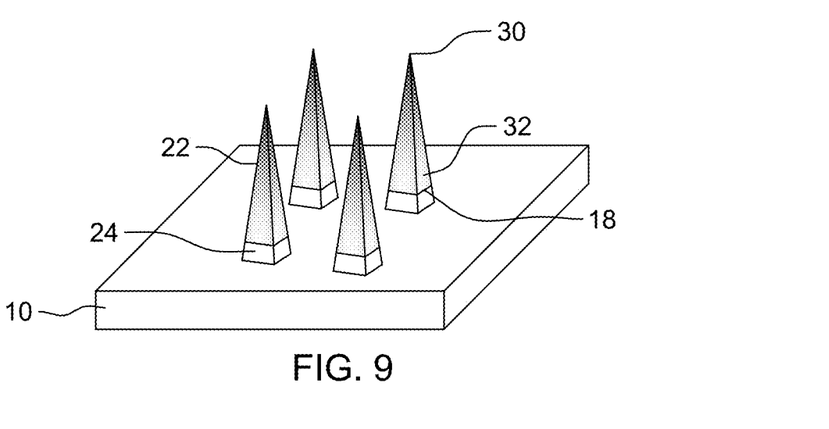
FIG. 9 is a perspective view of the SiGe pillars of FIG. 8.

The oxide 26 shown in FIG. 7 may be conventionally stripped off to result in the structure shown in FIGS. 8 and 9. FIG. 9 is a perspective view of the structure shown in FIG. 8. As can be seen, the final shape of the SiGe pillars 22 may be a pyramid.

The SiGe pillars 22 may be doped to lower their resistance. For example, the SiGe pillars 22 may be doped with p-type or n-type dopants. N-type dopants may include phosphorus, arsenic, antimony. P-type dopants may include boron, gallium, and indium. The SiGe pillars 22 may be doped after nanotip formation as shown in FIGS. 8 and 9. Alternatively, the SiGe pillars 22 may be doped earlier such as when the SiGe pillars 22 were initially formed, as shown in FIGS. 3 and 4, or other time before nanotip formation.

Figure 10:
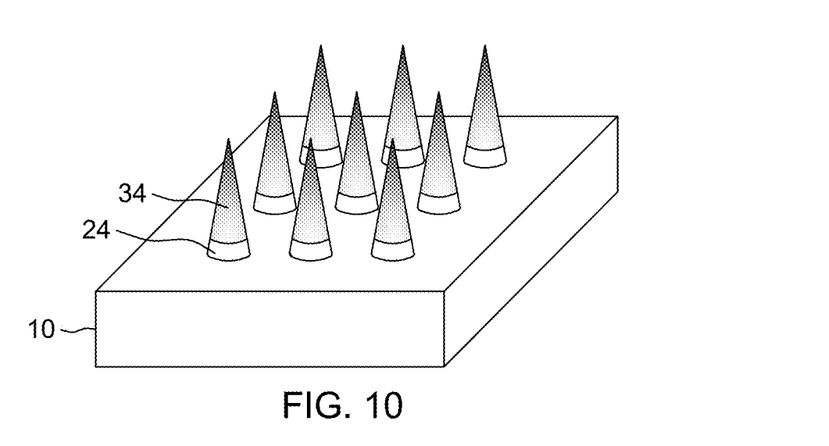
FIG. 10 is a perspective view similar to FIG. 9 but with different shaped SiGe pillars.

FIG. 10 illustrates a further exemplary embodiment in which different SiGe pillars 34 are shown on semiconductor substrate 10. The SiGe pillars 34 shown in FIG. 10 may be made by a process similar to that for the SiGe pillars 22 shown in FIGS. 8 and 9 with the exception that the starting structure (first shown in FIGS. 3 and 4) is a cylinder instead of a truncated pyramid. During the condensation process described with respect to FIG. 6, the cylinder-shaped SiGe pillars may transform into the cone-shaped SiGe pillars 34 shown in FIG. 10.

Figure 11:
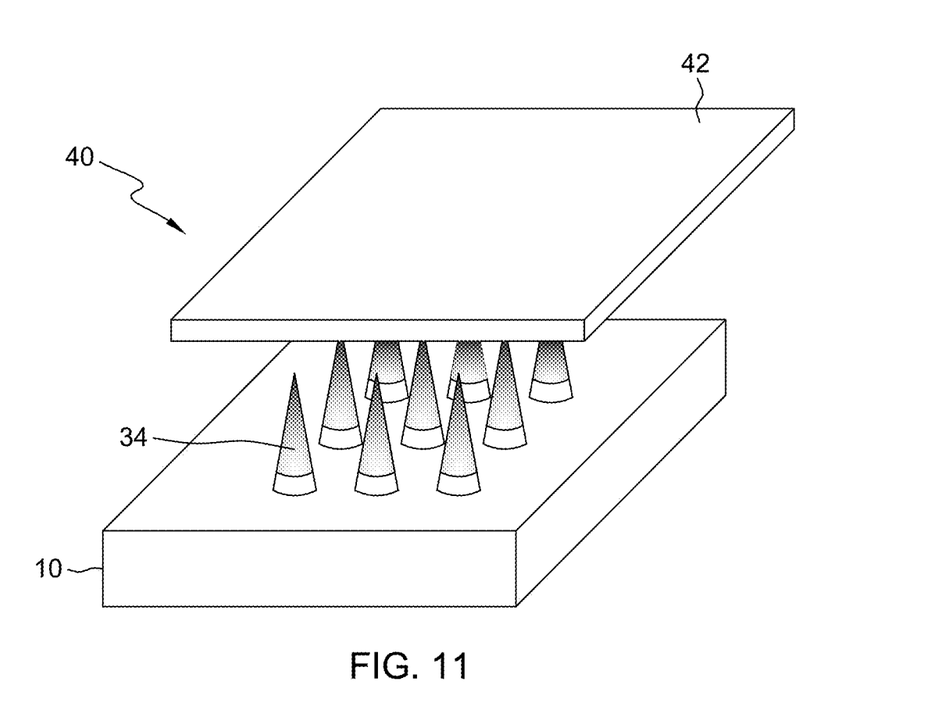
FIG. 11 is a perspective view of a high density field emitter apparatus in which the SiGe pillars of the exemplary embodiments are used as nanotip emitters.

The SiGe pillars 22, 34 may be used as nanotip emitters in a high density field emitter. Referring now to FIG. 11, there is illustrated an exemplary embodiment of a high density field emitter apparatus 40 using the nanotip emitters of the present invention. The apparatus 40 may include a semiconductor substrate 10 having an array of SiGe pillars 34. While SiGe pillars 34 (cone-shaped pillars) are shown in FIG. 11, the SiGe pillars 22 (pyramid-shaped pillars) may also be used in apparatus 40. The SiGe pillars 22, 34 may act as nanotip emitters. Opposed to the nanotip emitters may be an anode electrode 42. The SiGe pillars 22, 34 used as nanotip emitters in apparatus 40 may be heavily doped to lower their resistance.

Figure 12:
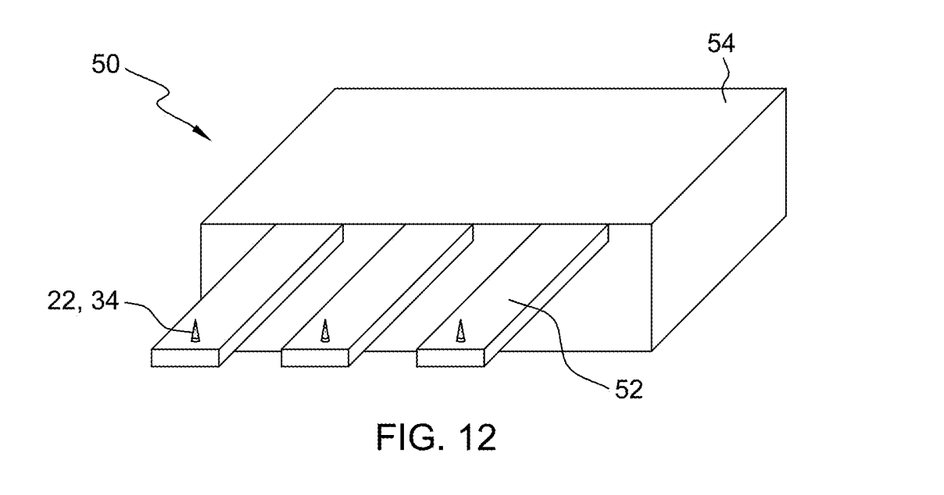
FIG. 12 is a perspective view of a cantilever apparatus in which the SiGe pillars of the exemplary embodiments are used as nanotip emitters.

The SiGe pillars 22, 34 may also be used in an apparatus, for example, for an atomic force microscope tip or in a cantilever apparatus. FIG. 12 illustrates the exemplary embodiment where the SiGe pillars 22, 34 may be used in a cantilever apparatus 50. The cantilevers 52 and substrate 54 may be made from, for example, silicon, silicon nitride and quartz-like nitride, by conventional microelectromechanical (MEMS) processes. According to processing described earlier, the SiGe pillars 22, 34 may be used as nanotips on the cantilevers 52. The SiGe pillars 22, 34 may be doped or undoped as needed.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A nanotip apparatus comprising a plurality of nanotips arranged in a pattern on a semiconductor base, each of the nanotips having a pointed tip and having a base portion in contact with the semiconductor base, each of the nanotips further comprising a gradient of silicon germanium (SiGe) extending continuously from the pointed tip to the semiconductor base with the highest concentration of germanium being at the pointed tip and the lowest concentration of germanium being at the base portion in contact with the semiconductor base.

2. The apparatus of claim 1 wherein the nanotips having a cone shape.

3. The apparatus of claim 1 wherein the nanotips having a pyramidal shape.

4. The apparatus of claim 1 wherein the plurality of nanotips are doped to increase their conductivity.

5. The apparatus of claim 4 further comprising an anode electrode opposite to the nanotip field emitters and the semiconductor base, the combination of the anode electrode, nanotip field emitters and the semiconductor base forming a field emitter.

6. The apparatus of claim 1 wherein the semiconductor base is a plurality of cantilevers with at least one nanotip field emitter on each nanotip and further comprising a semiconductor substrate joined to the plurality of cantilevers.

7. A method comprising:
    forming a substrate comprising a silicon germanium (SiGe) gradient layer on a semiconductor base such that there is a greater concentration of germanium at a top of the SiGe layer away from the semiconductor base than at a bottom of the SiGe layer in contact with the semiconductor base;
    patterning the SiGe gradient layer to form SiGe pillars;
    depositing an oxide layer over and between the SiGe pillars; and
    oxidizing the SiGe pillars such that a top of the SiGe pillars is oxidized faster than a bottom of the SiGe pillars in contact with the silicon base, the oxidizing causing the silicon in the SiGe pillars to react with oxygen to form an oxide and be partially removed from the SiGe pillars such that tapered SiGe pillars are formed with the top of the SiGe pillars forming a tip and having a greater concentration of germanium at the tip than at the bottom of the pillars.

8. The method of claim 7 wherein forming a substrate comprising a silicon germanium (SiGe) gradient layer on a semiconductor base comprises:
    forming a substrate comprising a SiGe layer on the semiconductor base; and
    thermally annealing the substrate to create the SiGe gradient layer.

9. The method of claim 8 wherein the process of thermally annealing is conducted in an inert environment such that a concentration of germanium at the tip of the SiGe pillars is less than the concentration of germanium in the tip prior to thermally annealing.

10. The method of claim 8 wherein the process of thermally annealing is conducted in an oxidation environment such that a concentration of germanium at the tip of the SiGe pillars is greater than the concentration of germanium in the tip prior to thermally annealing.

11. The method of claim 7 wherein forming a substrate comprising a silicon germanium (SiGe) gradient layer on a semiconductor base comprises:
    depositing the SiGe gradient layer by a phased deposition process in which silicon is initially deposited followed by gradually increasing the amount of germanium deposited while gradually decreasing the amount of silicon deposited until the SiGe gradient layer is formed.

12. The method of claim 7 wherein in the process of patterning the SiGe layer to form SiGe pillars, the SiGe pillars formed are truncated pyramids.

13. The method of claim 12 wherein in the process of oxidizing, the SiGe pillars formed after oxidizing are pyramids.

14. The method of claim 7 wherein in the process of patterning the SiGe layer to form SiGe pillars, the SiGe pillars formed are cylinders.

15. The method of claim 14 wherein in the process of oxidizing, the SiGe pillars formed after oxidizing are cones.

16. The method of claim 8 further comprising epitaxially depositing the SiGe layer on the silicon base.

17. A method comprising:
    forming a substrate comprising an array of SiGe pillars on a semiconductor substrate, the SiGe pillars having a germanium gradient within the SiGe pillars such that there is a greater concentration of germanium at a top of the SiGe pillars away from the semiconductor base than at a bottom of the SiGe pillars in contact with the semiconductor base; and
    oxidizing the SiGe pillars such that tapered SiGe pillars are formed with the top of the SiGe pillars forming a tip and having a greater concentration of germanium at the tip than at the bottom of the pillars.

18. The method of claim 17 wherein in the process of oxidizing, the SiGe pillars formed after oxidizing are pyramids.

19. The method of claim 17 wherein in the process of oxidizing, the SiGe pillars formed after oxidizing are cones.

20. The method of claim 17 wherein oxidizing the SiGe pillars includes oxidizing the SiGe pillars such that a top of the SiGe pillars is oxidized faster than a bottom of the SiGe pillars in contact with the silicon base, the oxidizing causing the silicon in the SiGe pillars to be partially removed from the SiGe pillars such that tapered SiGe pillars are formed with the top of the SiGe pillars forming the tip.

* * * * *